United States Patent
Blakeway

(10) Patent No.: US 7,984,540 B2
(45) Date of Patent: Jul. 26, 2011

(54) METHOD OF ENCLOSING AN ELECTRONIC CIRCUIT WITH A PERMANENTLY CLOSED ENCLOSURE

(75) Inventor: Douglas H. Blakeway, Langley (CA)

(73) Assignee: G4S Justice Services (Canada) Inc., Surrey, BC (CA)

( * ) Notice: Subject to any disclaimer, the term of this patent is extended or adjusted under 35 U.S.C. 154(b) by 173 days.

(21) Appl. No.: 12/292,629

(22) Filed: Nov. 21, 2008

(65) Prior Publication Data

US 2009/0089994 A1 Apr. 9, 2009

Related U.S. Application Data

(62) Division of application No. 10/796,209, filed on Mar. 10, 2004, now Pat. No. 7,456,355.

(51) Int. Cl.
*B23P 11/00* (2006.01)
*H02G 3/08* (2006.01)

(52) U.S. Cl. ............. 29/428; 29/426.4; 29/450; 29/453

(58) Field of Classification Search ............ 174/50, 174/53, 57, 58, 17 R, 520, 535, 559, 560, 174/561, 562; 220/3.2, 3.3, 3.4, 3.5, 3.6, 220/3.7, 3.8, 4.02; 340/573.4; 361/1, 600, 361/601; 29/453, 450, 426.4, 426.5, 426.6, 29/428
See application file for complete search history.

(56) References Cited

U.S. PATENT DOCUMENTS

| | | | |
|---|---|---|---|
| 3,860,739 A | 1/1975 | Kloth et al. | 174/58 |
| 3,922,478 A | 11/1975 | Perkey | 174/53 |
| 4,620,061 A | 10/1986 | Appleton | 220/3.8 |
| 5,276,279 A | 1/1994 | Brownlie et al. | 174/50 |
| 5,944,210 A | 8/1999 | Yetter | 220/4.02 |
| 6,111,760 A | 8/2000 | Nixon | 220/4.02 |
| 7,429,700 B2 * | 9/2008 | Kanamaru et al. | 174/50 |
| 7,456,355 B2 * | 11/2008 | Blakeway | 174/50 |
| 7,598,462 B2 * | 10/2009 | Burca et al. | 174/564 |
| 2008/0135576 A1 * | 6/2008 | Bacon | 222/36 |
| 2009/0251850 A1 * | 10/2009 | Morales et al. | 361/622 |

* cited by examiner

*Primary Examiner* — Essama Omgba

(57) ABSTRACT

An enclosure method comprising a first enclosure portion and a second enclosure portion configured to mate with the first enclosure portion. A receptacle is provided on the first enclosure portion. The receptacle has a frangible wall portion accessible from an exterior of the first enclosure portion. The frangible wall portion is operable to be broken from outside the enclosure method. A protrusion is provided on the second enclosure portion and the protrusion is operable to be received in the receptacle. A first locking member is connected to the frangible wall portion to extend inside the receptacle and a second locking member is provided on the protrusion. The second locking member is configured to engage the first locking member such that separation of the first and second enclosure portions is prevented unless the frangible wall portion is deliberately broken.

22 Claims, 6 Drawing Sheets

METHOD OF ENCLOSING AN ELECTRONIC CIRCUIT WITH A PERMANENTLY CLOSED ENCLOSURE

CROSS REFERENCE TO RELATED APPLICATIONS

This application claims the benefit of and is a divisional application of Ser. No. 10/796,209, filed Mar. 10, 2004, in the name of the same inventor, and which application has issued as U.S. Pat. 7,456,355 on Nov. 25, 2008.

BACKGROUND OF THE INVENTION

1. Field of Invention

This invention relates to enclosures and more particularly to a method of housing an electric circuit with a permanently closed enclosure.

2. Description of Related Art

Two-piece housings for enclosing electronics or other components are often designed in a manner that makes it easy to attach the two pieces, while at the same time ensuring that the two pieces are securely held to each other. Various methods using screws or pins have been developed to lock the two pieces together. However, often additional pieces or tools are required, which can complicate use of the enclosure, especially in applications where ease of fastening is desired. Snap together housings are available, but usually the two pieces of the housing cannot be separated from each other without physically damaging the mating pieces, rendering both pieces unusable.

SUMMARY OF THE INVENTION

In accordance with one aspect of the invention, there is provided an apparatus comprising a first enclosure portion and a second enclosure portion configured to mate with the first enclosure portion. A receptacle is provided on the first enclosure portion. The receptacle has a frangible wall portion accessible from an exterior of the first enclosure portion. The frangible wall portion is operable to be broken from outside the enclosure method. A protrusion is provided on the second enclosure portion and the protrusion is operable to be received in the receptacle. A first locking member is connected to the frangible wall portion to extend inside the receptacle and a second locking member is provided on the protrusion. The second locking member is configured to engage the first locking member such that separation of the first and second enclosure portions is prevented unless the frangible wall portion is deliberately broken.

The receptacle may include first and second guides on opposite sides of the first locking member.

The protrusion may include first and second rails disposed on opposite sides of the second locking member, the first and second rails being operable to be received in the first and second guides respectively.

The first and second guides and the first and second rails may be dimensioned such that the first and second rails are snugly received in the first and second guides respectively.

The first locking member may include a first projection extending substantially parallel to a direction of relative movement of the first and second enclosure portions when the protrusion is being received in the receptacle.

The second locking member may include a second projection extending generally parallel to a direction of relative movement of the first and second enclosure portions when the protrusion is being received in the receptacle.

The first projection may have a first abutting surface and the second projection may have a second abutting surface, the first and second abutting surfaces interfering with each other when the projection is received in the receptacle, to prevent separation of the first and second enclosure portions.

The first projection may be resiliently deformable.

The second projection has a camming surface operable to deform the first projection from a rest position while the protrusion is being inserted into the receptacle. The first projection may resiliently return substantially to its rest position when the protrusion is fully received in the receptacle. The first abutting surface of the first projection interferes with the second abutting surface of the second projection when the first projection is substantially in its rest position.

The first and second abutting surfaces may be shaped to maintain the first projection substantially in its rest position in response to relative movement of the first and second enclosure portions attempting to separate the first and second enclosure portions.

The first and second abutting surfaces may be complementarily angled.

The first projection may have a distal end portion and the first abutting surface may be on the distal end portion. The second enclosure portion may have a locking wall portion that is positioned immediately adjacent the distal end portion when the protrusion is fully received in the receptacle, such that the distal end portion is trapped between the second abutting surface and the locking wall portion.

The method may further include a movement preventer configured to prevent movement between the first and second enclosure portions when the protrusion is fully received in the receptacle.

The movement preventer may include complementary engaging components on the first and second enclosure portions respectively operable to snugly engage with each other.

The complementary engaging components may include a post on the first enclosure portion and a wall defining an opening on the second enclosure portion, the post being receivable in the opening.

The post and the wall defining the opening may be complementarily tapered to provide a snug fit therebetween.

The receptacle may have an adjacent wall portion adjacent the frangible wall portion and the adjacent wall portion and the frangible wall portion may be dimensioned such that the frangible wall portion is thinner than the adjacent wall portion.

The frangible wall portion may include an opening to facilitate breaking the frangible wall portion.

The frangible wall portion may include first and second openings on opposite sides of the first locking member to facilitate breaking the frangible wall portion.

The first enclosure portion may be formed from a plastic material.

In accordance with another aspect of the invention, there is provided a method of securing a location monitoring device to a live animal. The method involves engaging first and second mating enclosure portions with each other to enclose a monitoring circuit therewithin, such that a protrusion on the second enclosure portion is received in a receptacle on the first enclosure portion to engage a first locking member on an exteriorly accessible frangible portion of a wall of the receptacle with a second locking member on the second enclosure portion such that the first and second locking members cooperate to prevent separation of the first and second enclosure portions unless the frangible wall portion is deliberately broken.

In accordance with another aspect of the invention, there is provided a method of accessing an internal portion of an enclosure comprising first and second enclosure portions. The method involves breaking a frangible portion of a wall of a receptacle to which a first locking member on the first enclosure portion engaged with a second locking member on the second enclosure is attached, to permit first and second abutting surfaces of the first and second locking members respectively to be separated from interfering engagement, thereby permitting the first and second enclosure portions to be separated from each other.

Breaking the frangible portion may include inserting a tool in at least one opening in the frangible portion.

The present invention facilitates easily snapping together two mating pieces without using any additional parts or tools, other than the mating pieces themselves. This is especially desirable in scenarios where it is necessary to prevent tampering of the contents of the housing, or to cause irreversible damage to the housing providing irrefutable evidence of tampering, if tampering does take place. The two mating pieces can be legitimately separated in a way that only one mating piece is damaged, without any damage to the other mating piece or the contents of the housing. Thus, the undamaged mating piece and the contents of the housing can be re-used, if desired.

One particular application of this type of locking mechanism is in the design of the housing assembly for a tagging or monitoring device that may be strapped on an ankle or wrist of an individual to be monitored, such as an offender.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
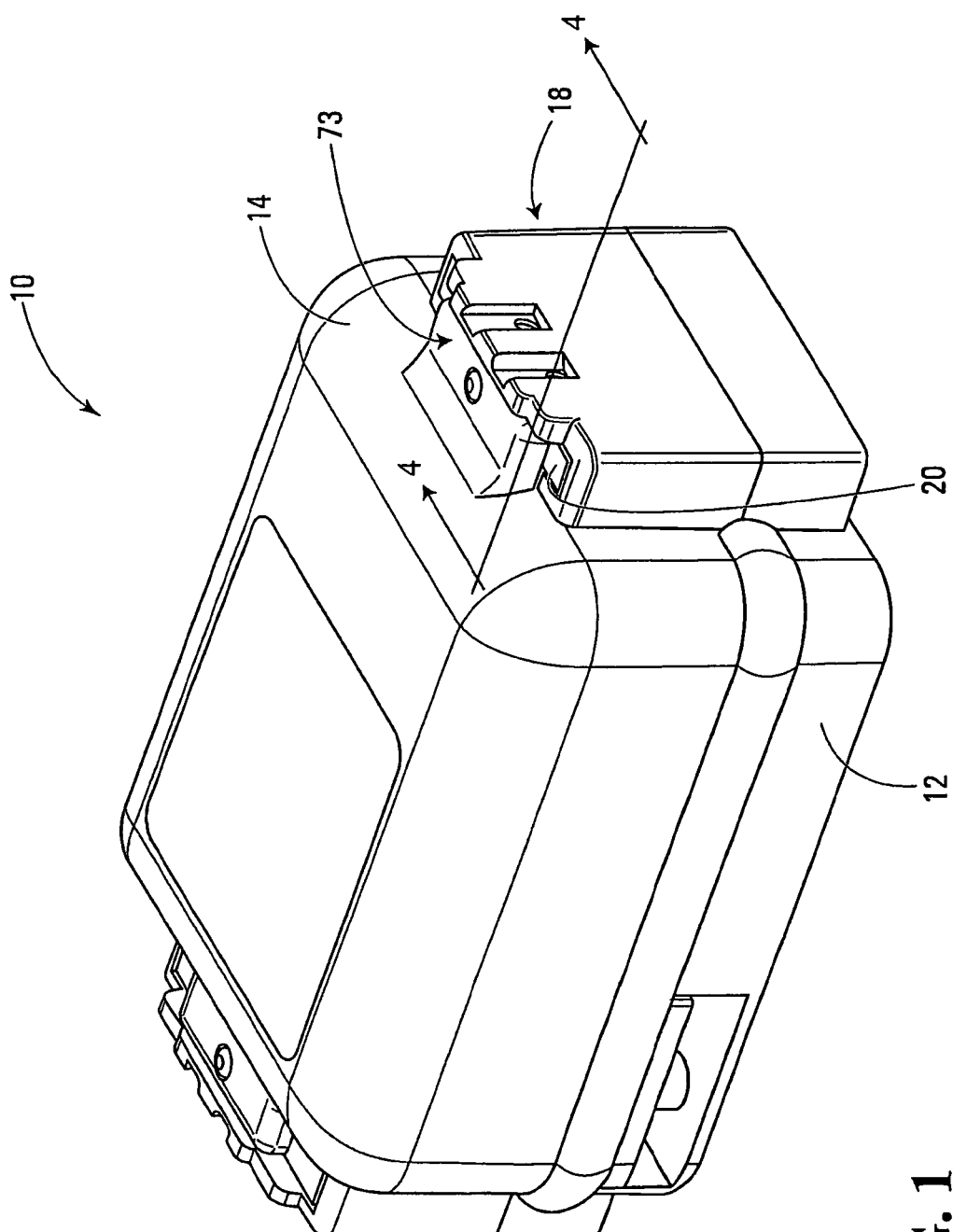
FIG. 1 is an oblique view of an enclosure apparatus according to a first embodiment of the invention.

Referring to FIG. 1, an enclosure apparatus according to a first embodiment of the invention is shown generally at 10. The apparatus includes a first enclosure portion 12, and a second enclosure portion 14 configured to mate with each other to form an enclosure. In the embodiment shown, the first and second enclosure portions are formed from a plastic material. A payload, such as a circuit board, for example, may be secured to either enclosure portion 12 or 14, for example.

Figure 2:
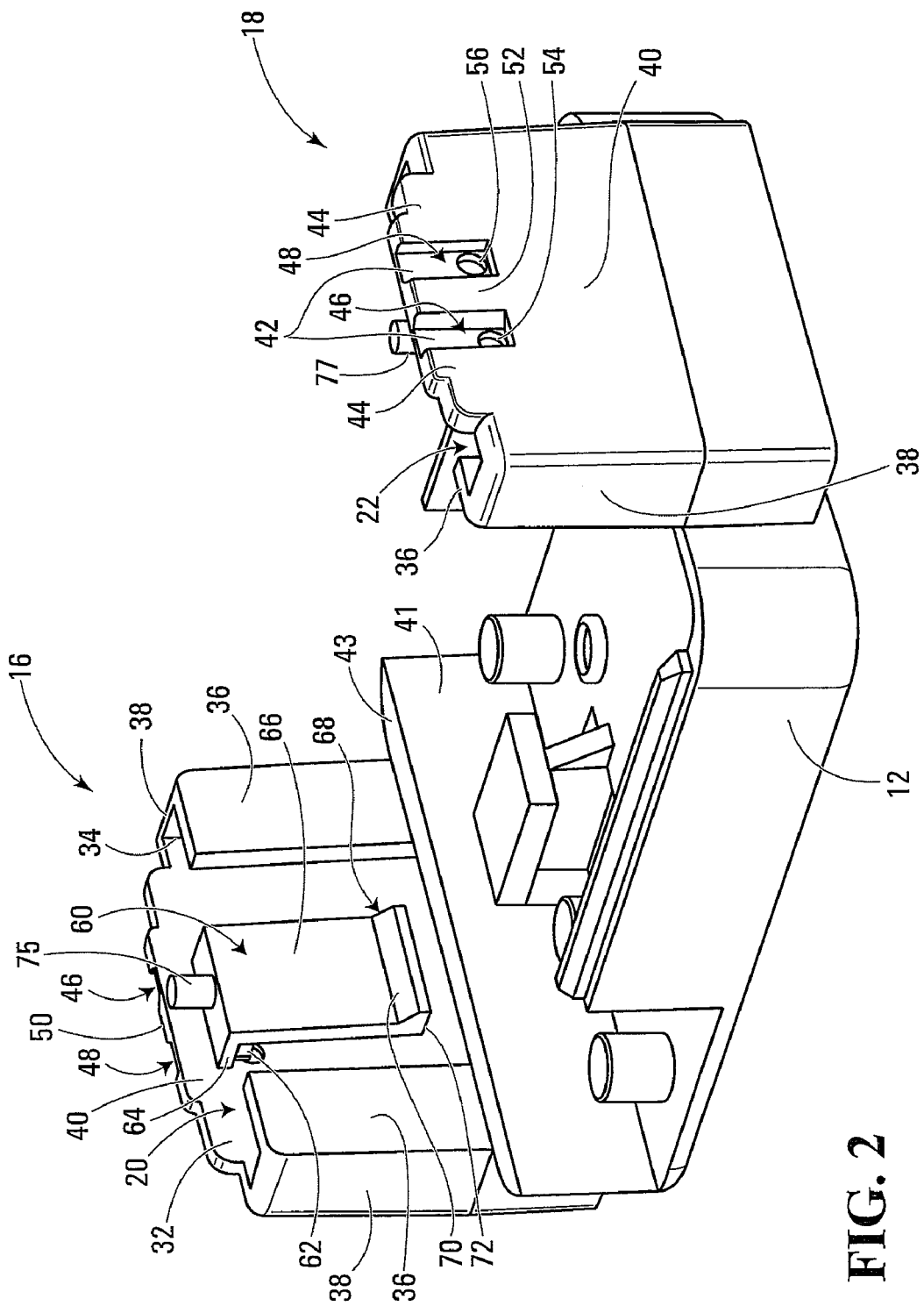
FIG. 2 is an oblique view of a first enclosure portion of the apparatus shown in FIG. 1.

Referring to FIG. 2, in the embodiment shown, the first enclosure portion 12 has first and second opposite ends shown generally at 16 and 18 on which are formed first and second receptacles shown generally at 20 and 22 respectively.

Figure 3:
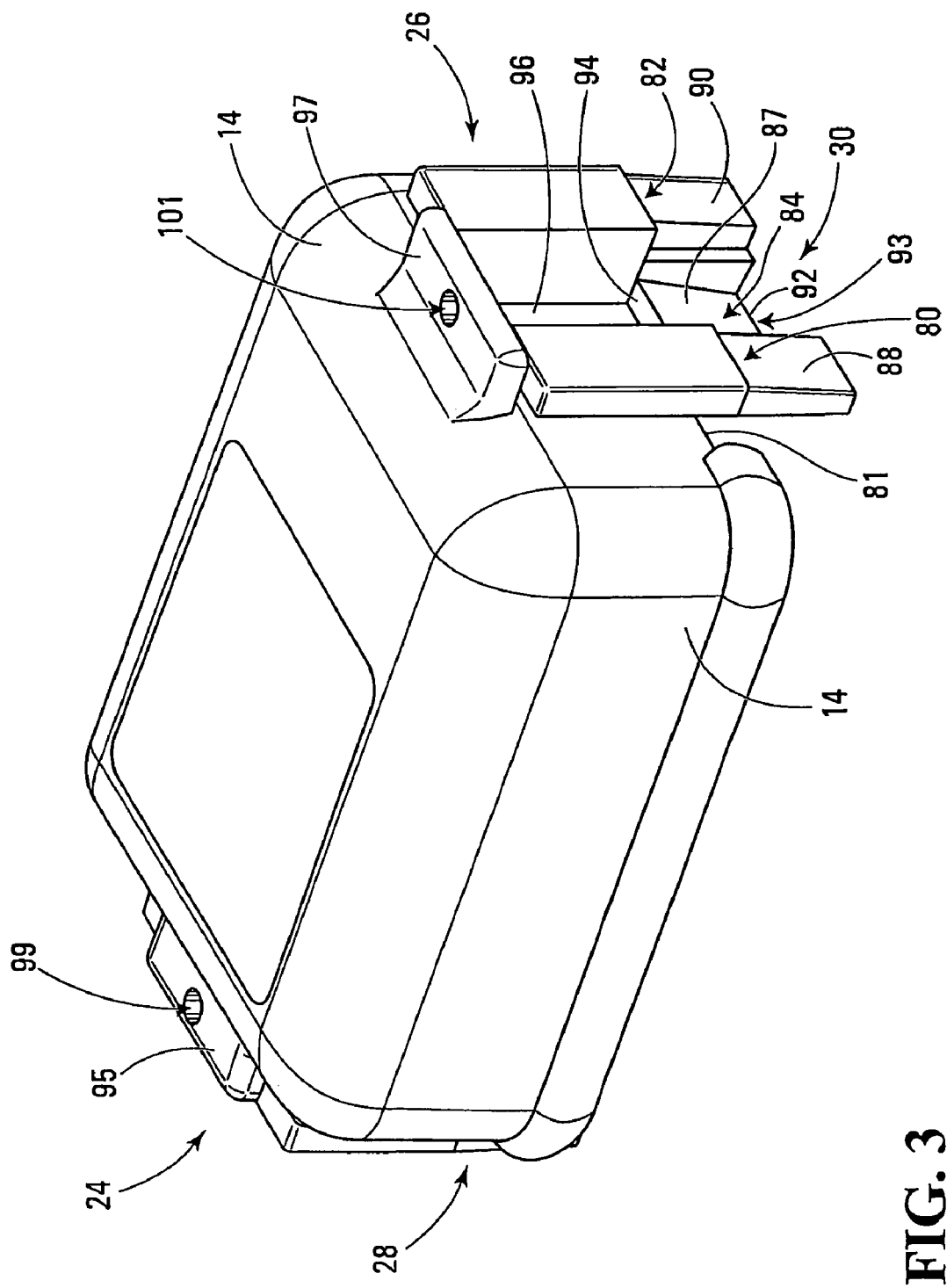
FIG. 3 is an oblique view of a second enclosure portion of the apparatus shown in FIG. 1.

Referring to FIG. 3, the second enclosure portion 14 has first and second opposite ends shown generally at 24 and 26 on which are formed first and second protrusions shown generally at 28 and 30 respectively. The first and second protrusions 28 and 30 are received in the first and second receptacles 20 and 22 respectively when the first and second enclosure portions 12 and 14 are in mating engagement.

Referring back to FIG. 2, the first and second receptacles 20 and 22 are similar. The view shown in FIG. 2 provides an inside view of the first receptacle 20 and an outside view of the second receptacle 22. The first and second receptacles 20 and 22 are similar. The receptacles 20 and 22 each include a locking member 60 and first and second guides 32 and 34 formed on opposite sides of the locking member. In this embodiment, the first and second guides 32 and 34 extend above the nominal height of the first enclosure portion. The first and second guides 32 and 34 each include an inner wall 36 generally parallel to the end of the first enclosure portion 12, an outwardly projecting wall 38 extending at right angles to the inner wall 36 and an external wall 40 extending between the outwardly projecting walls 38, parallel to the inner walls 36 and spaced apart therefrom. An inner, upstanding wall 41 extends parallel to, between and adjacent to the inner walls 36 of the first and second guides 32 and 34 and a lower wall portion 45 seen best in FIG. 4, extends between the upstanding wall 41 and the external wall 40 to prevent access to the space formed therebetween.

The external wall 40 has frangible wall portions 42 and adjacent wall portions 44 extending about the frangible wall portions. The adjacent Wall portions 44 and the frangible wall portions 42 are dimensioned such that the frangible wall portions are thinner than the adjacent wall portions.

In the embodiment shown, the frangible wall portions 42 are formed by first and second spaced apart recesses 46 and 48 extending from an edge 50 of the external wall 40 part way into the external wall. A bridge portion 52 is formed between the first and second recesses 46 and 48. The external wall 40 may be about ⅛ inches in thickness and the frangible wall portions 42 may be about 1/16 inches in thickness, for example. The bridge portion 52 may be about ¼ inches in width, for example.

In the embodiment shown the frangible wall portions 42 have respective openings 54 and 56 therein that are sized to permit respective jaws of diagonal cutters, for example to be received therein to permit the bridge portion 52 to be cut, enabling the frangible wall portion 42 to be relatively easily broken as will be explained more fully below.

A first locking member shown generally at 60 is secured to the frangible wall portions 42 by tabs, only one of which is shown at 62. The tabs may be ultrasonically welded, for example, to the frangible wall portions 42, or may be formed therein at a location between the openings 54 and 56 and the edge 50. The tabs 62 are connected to a support member 64 of the first locking member 60. The support member 64 projects inwardly of the first enclosure portion 12 into an area between the first and second guides 32 and 34. The first locking member 60 further includes a first projection 66 extending parallel to a direction of relative movement of the first and second enclosure portions 12 and 14 when the first and second enclosure portions are brought together into mating engagement. The first projection 66 has an enlarged free distal end portion shown generally at 68, having a outwardly angled surface 70 and a first abutting surface 72 extending generally at right angles to the direction in which the first locking member 60 extends, although as will be appreciated below, this first abutting surface 72 may also be slightly angled. In this embodiment, the first abutting surface 72 is spaced apart from a top surface 43 of the upstanding wall 41.

The apparatus further includes a movement preventer shown generally at 73 in FIG. 1. The movement preventer 73 is configured to prevent movement between the first and second enclosure portions 12 and 14. Referring to FIG. 2, in this embodiment, the movement preventer 73 includes first and second cylindrical posts 75 and 77 on respective support members 64 of the first locking members 60.

Referring to FIG. 3, as stated above, the first and second protrusions 28 and 30 are received in the first and second receptacles 20 and 22 (FIG. 2) respectively, when the enclosure portions are brought together. The first and second protrusions 28 and 30 are the same and therefore only one will be described.

The second protrusion 30 is seen best in FIG. 3 and protrudes beyond a nominal edge 81 of the second enclosure portion 14. The second protrusion 30 includes first and second spaced apart rails 80 and 82 and a second locking member 84 disposed between the first and second rails. The second locking member 84 includes a second projection 86 and the first and second rails 80 and 82 and the second projection 86 extend parallel to the direction of relative movement of the first and second enclosure portions 12 and 14 when the first and second protrusions 28 and 30 are being received in the first and second receptacles 20 and 22 (FIG. 2), respectively.

The first and second rails 80 and 82 are positioned on the second enclosure portion 14 and are dimensioned such that they are snugly received in corresponding first and second guides (32 and 34 in FIG. 2) of the first enclosure portion (12 in FIG. 2). For this purpose, the first and second rails 80 and 82 may have distal, slightly tapered portions 88 and 90 respectively. In general, the rails are made relatively large, for strength.

The second projection 86 has an outer edge 92 forming a distal end 93 thereof and a second abutting surface 94 that are spaced apart and face away from each other in opposite directions. The second projection 86 is tapered outwardly such that it is thinner at the outer edge 92 and thicker at the second abutting surface 94. The second projection 86 has a camming surface 87 that defines the taper between the distal end 93 and the second abutting surface 94. The second locking member 84 further has a locking wall portion 96 immediately adjacent to and extending generally at right angles to the second abutting surface 94 and parallel to the end of the second enclosure portion 14.

The second enclosure portion 14 further includes first and second cover portions 95 and 97 that depend from respective ends 24 and 26 of the second enclosure portion 14 and which extend between the first and second rails 80 and 82 and over the locking wall portion 96 and second locking member 84. The first and second cover portions 95 and 97 have respective openings 99 and 101 operable to receive the posts 75 and 77 shown in FIG. 2 on the first enclosure portion 12, respectively. The posts 75 and 77 and openings 99 and 101 are dimensioned such that the posts are snugly received in the openings, and thus the posts and openings cooperate to prevent relative movement between the first and second enclosure portions 12 and 14.

Figure 4:
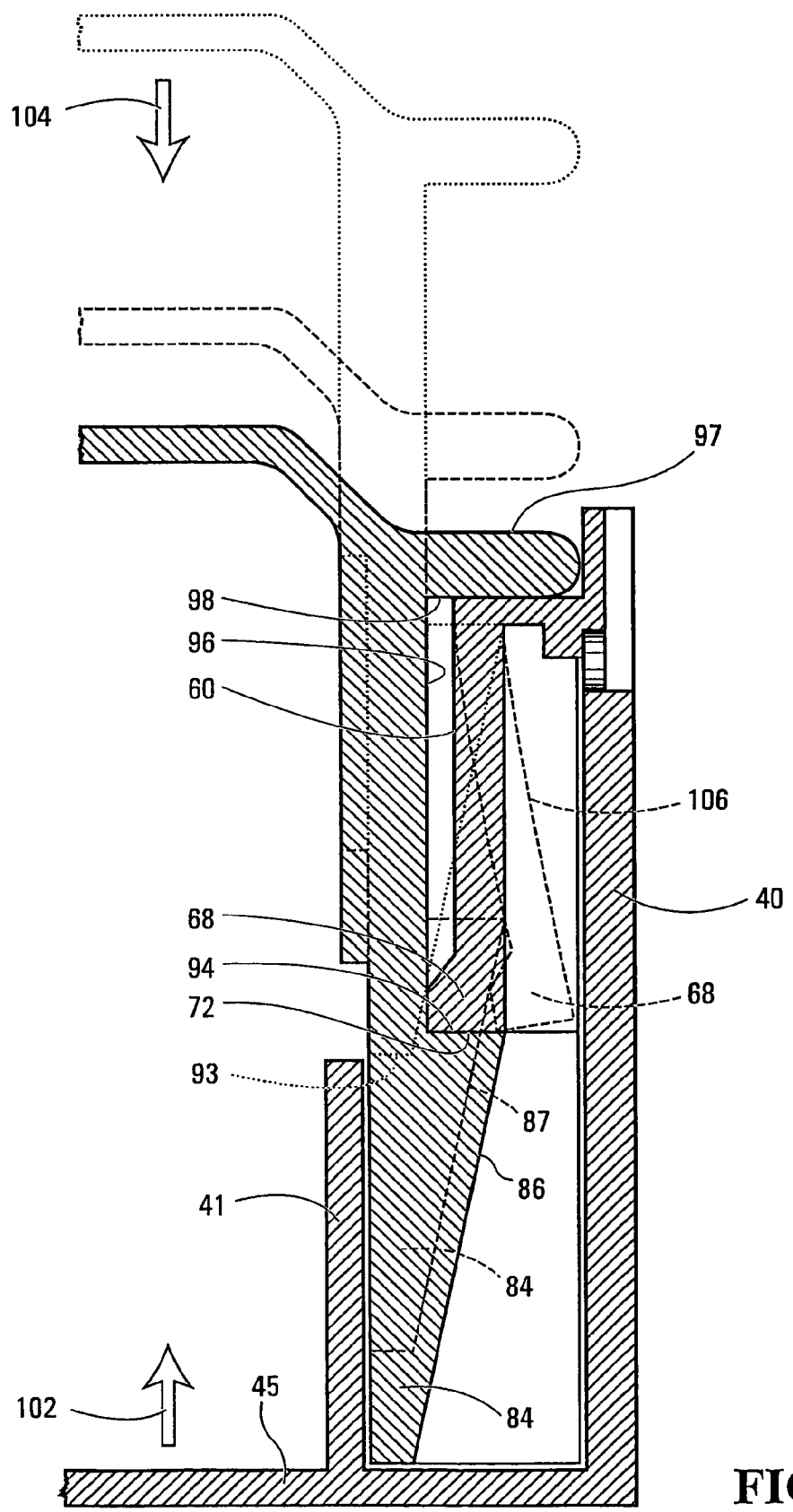
FIG. 4 is a cross-sectional view of the apparatus shown in FIG. 1 taken along lines 4-4.

Referring to FIG. 4, when the first and second enclosure portions 12 and 14 are fully engaged, the first and second locking members 60 and 84 are engaged such that the first and second abutting surfaces 72 and 94 interfere with each other to prevent separation of the first and second enclosure portions 12 and 14.

To achieve engagement of the first and second locking members 60 and 84, the first and second enclosure portions 12 and 14 are positioned such that at each end of the enclosure portions the distal end 93 of the second locking member 84 is positioned between the distal end portion 68 of the first locking member 60 and the upstanding wall 41, as shown in broken outline in FIG. 4. Then, the first and second enclosure portions 12 and 14 are pushed together in the directions indicated by arrows 102 and 104. Pushing the first and second enclosure portions 12 and 14 together causes the camming surface 87 of the second projection 86 to bear upon the distal end portion 68 of the first projection, causing the first projection to deform outwardly from its rest position, toward the external wall 40 as shown in broken outline at 106, while the camming surface 87 is in contact therewith. The thickness of the support member 64 may determine the amount of additional force required to deform the first projection 66. Desirably, the support member 64 is dimensioned such that a moderate amount of force is required to deform the first projection 66 before the first and second enclosure portions 12 and 14 are fully engaged. When the second projection 86 is fully received in the receptacle 22, as shown in solid outline in FIG. 4, the camming surface 87 no longer bears upon the distal end portion 68 and the first projection 66 is allowed to resiliently return to its rest position shown in solid outline. In this position, the first and second abutting surfaces 72 and 94 abut each other and interfere with each other to prevent separation of the first and second enclosure portions 12 and 14. No access is provided to the first and second locking members 60 and 84 on either end of the enclosure apparatus so formed and therefore they cannot be disengaged.

Figure 5:
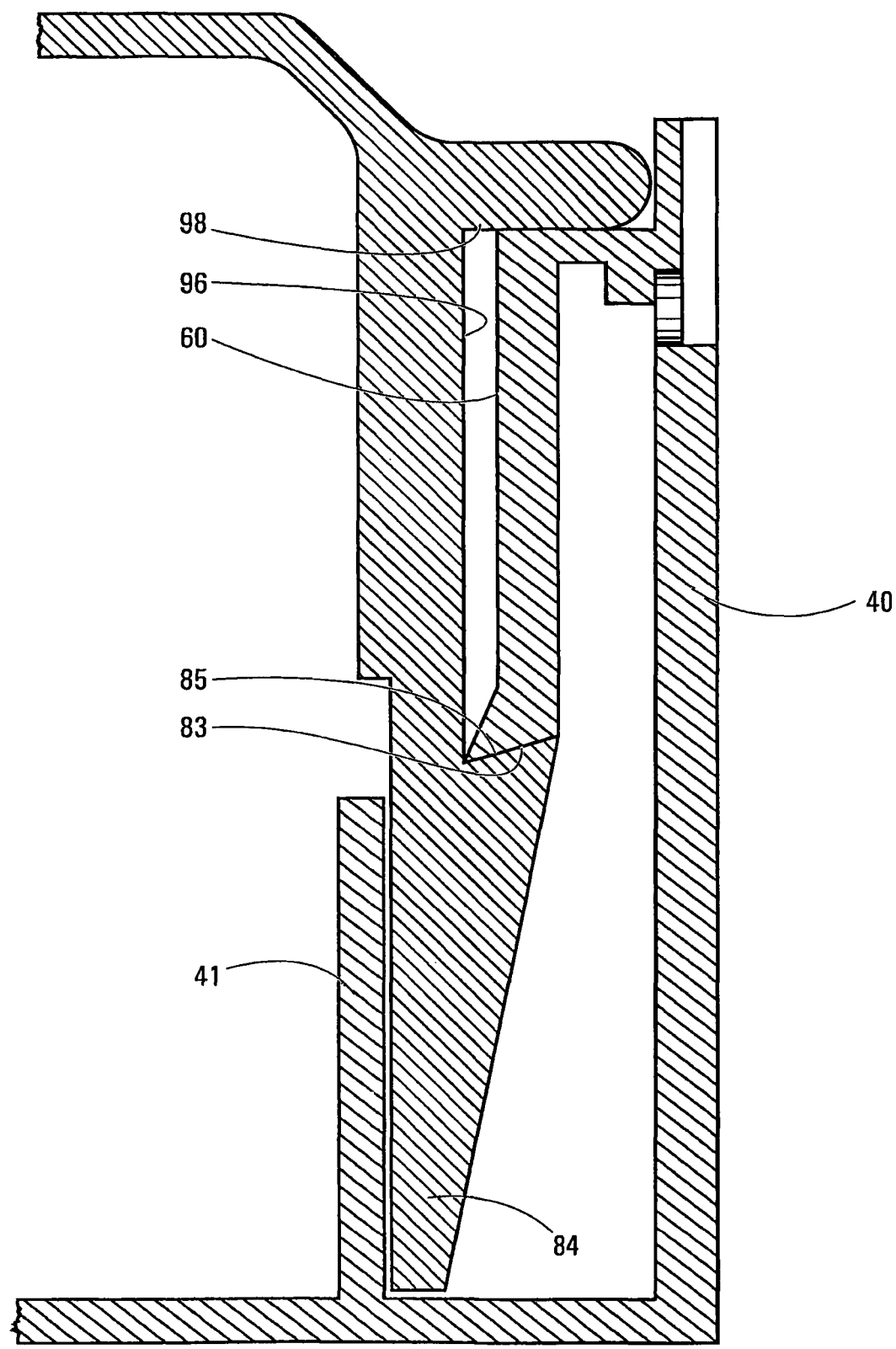
FIG. 5 is a section view of an alternative embodiment of the apparatus as would be seen if taken along lines 4-4 in FIG. 1.

The first and second abutting surfaces 72 and 94 are shaped to maintain the first projection 66 substantially in its rest position shown in solid outline even in response to relative movement of the first and second enclosure portions 12 and 14 attempting to separate them. In the embodiment shown, this may be achieved by forming the first and second abutting surfaces 72 and 94 such that they extend at right angles to the direction of movement required to separate the first and second enclosure portions 12 and 14. Alternatively the first and second abutting surfaces 72 and 94 may be slightly angled as shown at 83 and 85 in FIG. 5 such that opposing forces on the first and second enclosure portions 12 and 14 tending to separate the enclosure portions cause the first locking member 60 to be deflected toward the adjacent locking wall portion 96 which also prevents separation of the first and second enclosure portions 12 and 14. Effectively, the distal end portion 68 of the first projection 66 is trapped between the second abutting surface 94 and the adjacent locking wall portion 96.

Also when the first and second enclosure portions 12 and 14 are fully engaged, the posts 75 and 77 are fully received in respective openings 99 and 101 which further prevents relative movement between the first and second enclosure portions 12 and 14. Lateral movement is especially prevented. It will be appreciated that in general, the posts 75 and 77 are shaped complementarily to the openings 99 and 101 in which they are received. While, the posts 75 and 77 and openings 99 and 101 have been shown as being circular cylindrical, the posts and openings may be, rectangular or any other shape and/or may be tapered to form a wedge-fit therebetween.

In order to separate the first and second enclosure portions 12 and 14 to access an internal portion of the enclosure, it is necessary to deliberately break the frangible wall portions 42 on each end of the first enclosure portion 12, thereby damaging the first enclosure portion. Breaking the frangible wall portions 42 may be achieved by inserting the jaws of a pair of diagonal cutters, for example, into respective openings 54 and 56 and cutting through the bridge portion 52. The frangible wall portions 42 may then be pried away from the surrounding adjacent wall portions 44, leaving the first locking member 60 loose in the space defined by the bottom surface 98 of the top cover portion, the locking wall portion 96, the second abutting surface 94 and the exterior wall 40. With the first locking member 60 no longer connected to the exterior wall 40, the first and second abutting surfaces 72 and 94 of the first and second locking members 60 and 84 respectively may be separated from interfering engagement, thereby permitting the first and second enclosure portions 12 and 14 to be separated from each other.

The first and second enclosure portions 12 and 14 may be separated relatively easily, by pulling them apart in directions opposite to the directions shown by arrows 102 and 104, respectively.

Since the frangible wall portions are broken to facilitate separation of the first and second enclosure portions 12 and 14, the damaged exterior walls 40 provide evidence of tampering with the enclosure.

Figure 6:
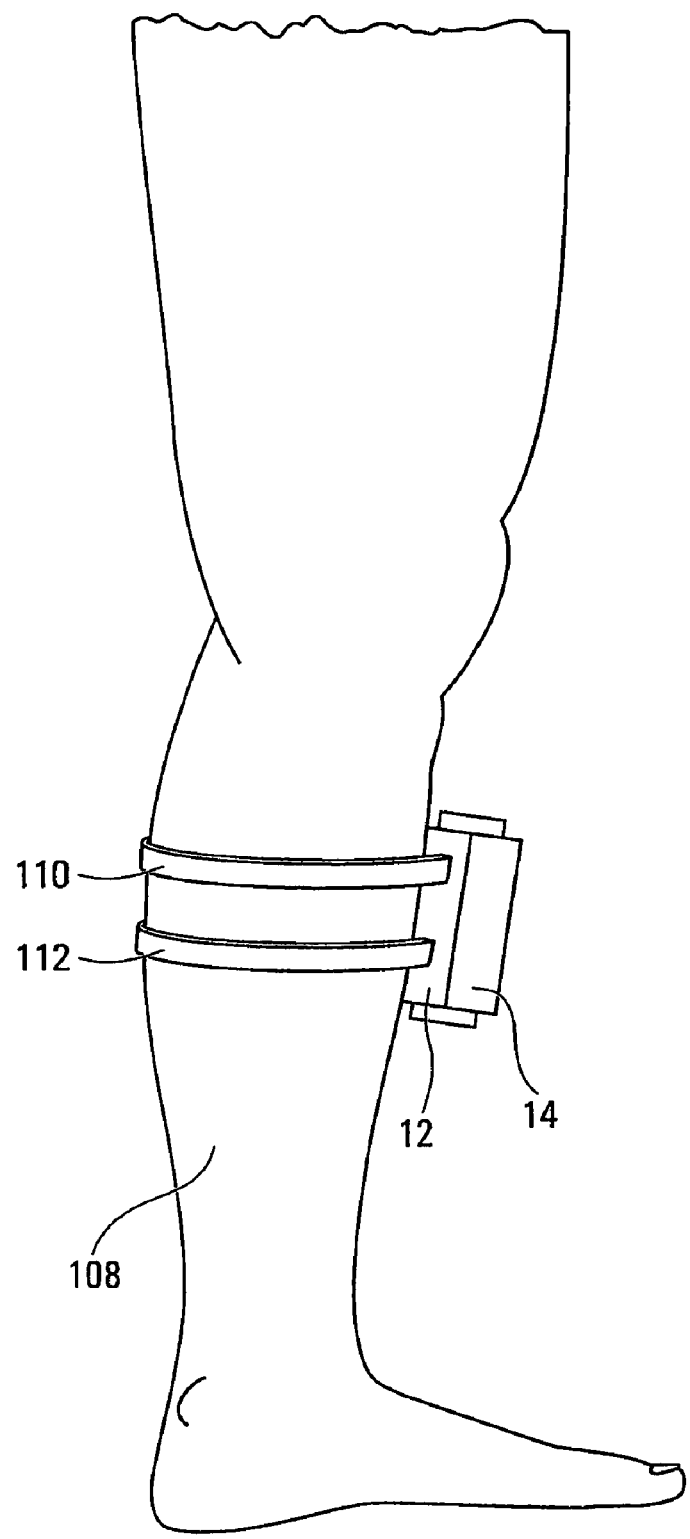
FIG. 6 is a schematic representation of the installation of the enclosure apparatus of FIG. 1 on a human.

One particular application of the enclosure described herein is in securing a location monitoring device to a live animal or human. The location monitoring device may be a device used by corrections authorities to ensure an offender is confined to a certain area such as a home, for example. Referring to FIG. 6, the first enclosure portion 12 may be secured to the offender's leg 108 by non-removable straps 110 and 112. Then the first and second mating enclosure portions 12 and 14 may be engaged with each other to enclose a monitoring circuit therewithin. Referring to FIG. 4, as the first and second enclosure portions 12 and 14 are engaged, the protrusions 28 and 30 on the second enclosure portion 14 are fully received in corresponding receptacles 20 and 22 on the first enclosure portion 12 to engage the first locking member 60, on the exteriorly accessible frangible wall portions 42 of the receptacles, with the second locking member 84 on the second enclosure portion 14 such that the first and second locking members cooperate to prevent separation of the first and second enclosure portions unless the frangible wall portions 42 are deliberately broken. Should the offender tamper with the enclosure, the only way to get into the enclosure is to break the frangible wall portions 42, which causes irreversible damage to the first enclosure portion 12, enabling enforcement authorities to see that tampering has occurred.

The present invention provides a permanently closed enclosure that when opened, leaves at least one component, namely the first enclosure portion 12 permanently damaged. However, only the first enclosure portion 12 is damaged. The second enclosure portion 14 may be reusable and thus costs for using such enclosures are reduced, because only one portion of the enclosure need be replaced.

While specific embodiments of the invention have been described and illustrated, such embodiments should be considered illustrative of the invention only and not as limiting the invention as construed in accordance with the accompanying claims.

What is claimed is:

1. A method of housing an electric circuit, the method comprising:
   securing the electric circuit to at least one of first and second mating enclosure portions;
   engaging said first and second mating enclosure portions with each other to enclose the electric circuit therewithin, by:
      causing a protrusion on said second enclosure portion to be received in a receptacle on said first enclosure portion; and
      engaging a first locking member on an exteriorly accessible frangible portion of a wall of said receptacle with a second locking member on said second enclosure portion such that said first and second locking members cooperate to prevent separation of said first and second enclosure portions unless said frangible wall portion is deliberately broken.

2. The method of claim 1 wherein said engaging is performed while said causing is being performed.

3. The method of claim 1 wherein said causing said protrusion on said second enclosure portion to be received in said receptacle on said first enclosure portion comprises causing first and second rails disposed on opposite sides of said second locking member to be received in first and second guides on opposite sides of said first locking member, respectively.

4. The method of claim 3 wherein causing first and second rails disposed on opposite sides of said second locking member to be received in first and second guides comprises snugly receiving said first and second rails in said first and second guides respectively.

5. The method of claim 4 wherein engaging comprises:
   causing a camming surface on said protrusion to resiliently deform said first locking member from a rest position while said protrusion is being inserted into said receptacle;
   permitting said first locking member to resiliently return substantially to its rest position when said protrusion is fully received in said receptacle; and
   causing a first abutting surface on said first locking member to interfere with a second abutting surface on said protrusion when said first locking member is substantially in its rest position.

6. The method of claim 5 further comprising trapping said first locking member between said second abutting surface and an adjacent locking wall portion of said second locking member.

7. The method of claim 6 wherein trapping comprises causing angled first and second abutting surfaces to engage with each other.

8. The method of claim 7 further comprising preventing movement between said first and second enclosure portions when said protrusion is fully received in said receptacle.

9. The method of claim 8 wherein preventing movement comprises engaging complementary engaging components on said first and second enclosure portions.

10. The method of claim 9 wherein engaging complementary engaging components comprises receiving a post on said first enclosure portion in a complementary shaped opening defined by a wall on said second enclosure portion.

11. The method of claim 10 further comprising covering said first locking member with a cover portion depending from an end of said second enclosure portion and defining said opening in which said post is received by a wall in said cover portion.

12. The method of claim 1 wherein engaging comprises:
   causing a camming surface on said protrusion to resiliently deform said first locking member from a rest position while said protrusion is being inserted into said receptacle;
   permitting said first locking member to resiliently return substantially to its rest position when said protrusion is fully received in said receptacle; and
   causing a first abutting surface on said first locking member to interfere with a second abutting surface on said protrusion when said first locking member is substantially in its rest position.

13. The method of claim 12 further comprising trapping said first locking member between said second abutting surface and an adjacent locking wall portion of said second locking member.

14. The method of claim 13 wherein trapping comprises causing angled first and second abutting surfaces to engage with each other.

15. The method of claim 1 further comprising preventing movement between said first and second enclosure portions when said protrusion is received in said receptacle.

16. The method of claim 15 wherein preventing movement comprises engaging complementary engaging components on said first and second enclosure portions.

17. The method of claim 16 wherein engaging complementary engaging components comprises receiving a post on said first enclosure portion in a complementary shaped opening defined by a wall on said second enclosure portion.

18. The method of claim 17 further comprising covering said first locking member with a cover portion depending from an end of said second enclosure portion and defining said opening in which said post is received by a wall in said cover portion.

19. A method of securing a location monitoring device to a live animal, the method comprising the method of claim 1 and further comprising securing at least one of said first and second mating enclosure portions to an appendage of the animal.

20. The method of claim 1 further comprising accessing an internal portion of said first and second enclosure portions when enclosing said electrical circuit by:
  breaking a frangible portion of a wall of a receptacle to which a first locking member on the first enclosure portion engaged with a second locking member on the second enclosure portion is attached, to disconnect said first locking member from said wall, such that said first locking member is loose in a space defined by a surface of said second cover portion, a locking wall portion on the second locking member, an abutting surface on the second locking member, and an exterior wall of the first enclosure portion; and
  separating said first and second enclosure portions.

21. The method of claim 20 wherein breaking said frangible portion comprises inserting a tool in at least one opening in said frangible portion.

22. The method of claim 20 wherein separating comprises moving the first and second enclosure portions relative to each other while maintaining said first locking member within said space, until said first and second enclosure portions are separated sufficiently to permit said first locking member to exit said space.

* * * * *